(12) United States Patent
Suzuki et al.

(10) Patent No.: US 10,103,324 B2
(45) Date of Patent: Oct. 16, 2018

(54) MEMORY DEVICE AND MANUFACTURING METHOD OF MEMORY DEVICE

(71) Applicant: Toshiba Memory Corporation, Tokyo (JP)

(72) Inventors: Kunifumi Suzuki, Yokkaichi Mie (JP); Kazuhiko Yamamoto, Yokkaichi Mie (JP)

(73) Assignee: Toshiba Memory Corporation, Tokyo (JP)

( * ) Notice: Subject to any disclaimer, the term of this patent is extended or adjusted under 35 U.S.C. 154(b) by 179 days.

(21) Appl. No.: 14/839,871

(22) Filed: Aug. 28, 2015

(65) Prior Publication Data

US 2016/0293839 A1    Oct. 6, 2016

(30) Foreign Application Priority Data

Mar. 31, 2015    (JP) ................. 2015-072344

(51) Int. Cl.
*H01L 45/00* (2006.01)
*H01L 27/24* (2006.01)

(52) U.S. Cl.
CPC ............ *H01L 45/06* (2013.01); *H01L 27/249* (2013.01); *H01L 45/128* (2013.01); *H01L 45/1226* (2013.01); *H01L 45/1293* (2013.01); *H01L 45/144* (2013.01); *H01L 27/2454* (2013.01)

(58) Field of Classification Search
None
See application file for complete search history.

(56) References Cited

U.S. PATENT DOCUMENTS

| 5,751,056 A | 5/1998 | Numata |
| 2008/0149913 A1 | 6/2008 | Tanaka et al. |
| 2010/0176368 A1* | 7/2010 | Ko ............... H01L 27/2409 257/5 |
| 2012/0287697 A1 | 11/2012 | Hanzawa et al. |

FOREIGN PATENT DOCUMENTS

JP    2009049183 A    3/2009

* cited by examiner

*Primary Examiner* — Robert Carpenter
(74) *Attorney, Agent, or Firm* — Patterson & Sheridan, LLP

(57) ABSTRACT

A memory device includes a plurality of bit lines, including first and second bit lines, extending in a first direction away from a substrate, a plurality of word lines, including first and second word lines, extending in a second direction crossing the first direction and substantially parallel to a surface of the substrate, a first variable resistance film between the first word line and the first bit line and a second variable resistance film between the second word line and the second bit line, an insulating material electrically isolating the first and second word lines and the first and second bit lines, and a plurality of air gaps between the first and second bit lines.

14 Claims, 17 Drawing Sheets

MEMORY DEVICE AND MANUFACTURING METHOD OF MEMORY DEVICE

CROSS-REFERENCE TO RELATED APPLICATION

This application is based upon and claims the benefit of priority from Japanese Patent Application No. 2015-072344, filed Mar. 31, 2015, the entire contents of which are incorporated herein by reference.

FIELD

Embodiments described herein relate generally to a memory device and a manufacturing method of the memory device.

BACKGROUND

Recently, a variable resistance film has been developed, and a memory device using such a variable resistance film has been proposed.

DESCRIPTION OF THE DRAWINGS

FIG. 2A shows the cross section of area C in FIG. 1 and FIG. 2B shows the cross section of area D in FIG. 1.

FIG. 5A shows a set operation and FIG. 5B shows a reset operation.

DETAILED DESCRIPTION

Embodiments provide a memory device and the manufacturing method of the memory device in which the interference between memory cells is suppressed.

In general, according to one embodiment, a memory device includes a plurality of bit lines, including first and second bit lines, extending in a first direction away from a substrate, a plurality of word lines, including first and second word lines, extending in a second direction crossing the first direction and substantially parallel to a surface of the substrate, a first variable resistance film between the first word line and the first bit line and a second variable resistance film between the second word line and the second bit line, an insulating material electrically isolating the first and second word lines and the first and second bit lines, and a plurality of air gaps between the first and second bit lines.

First Embodiment

Firstly, the first embodiment will be described.

Figure 1:
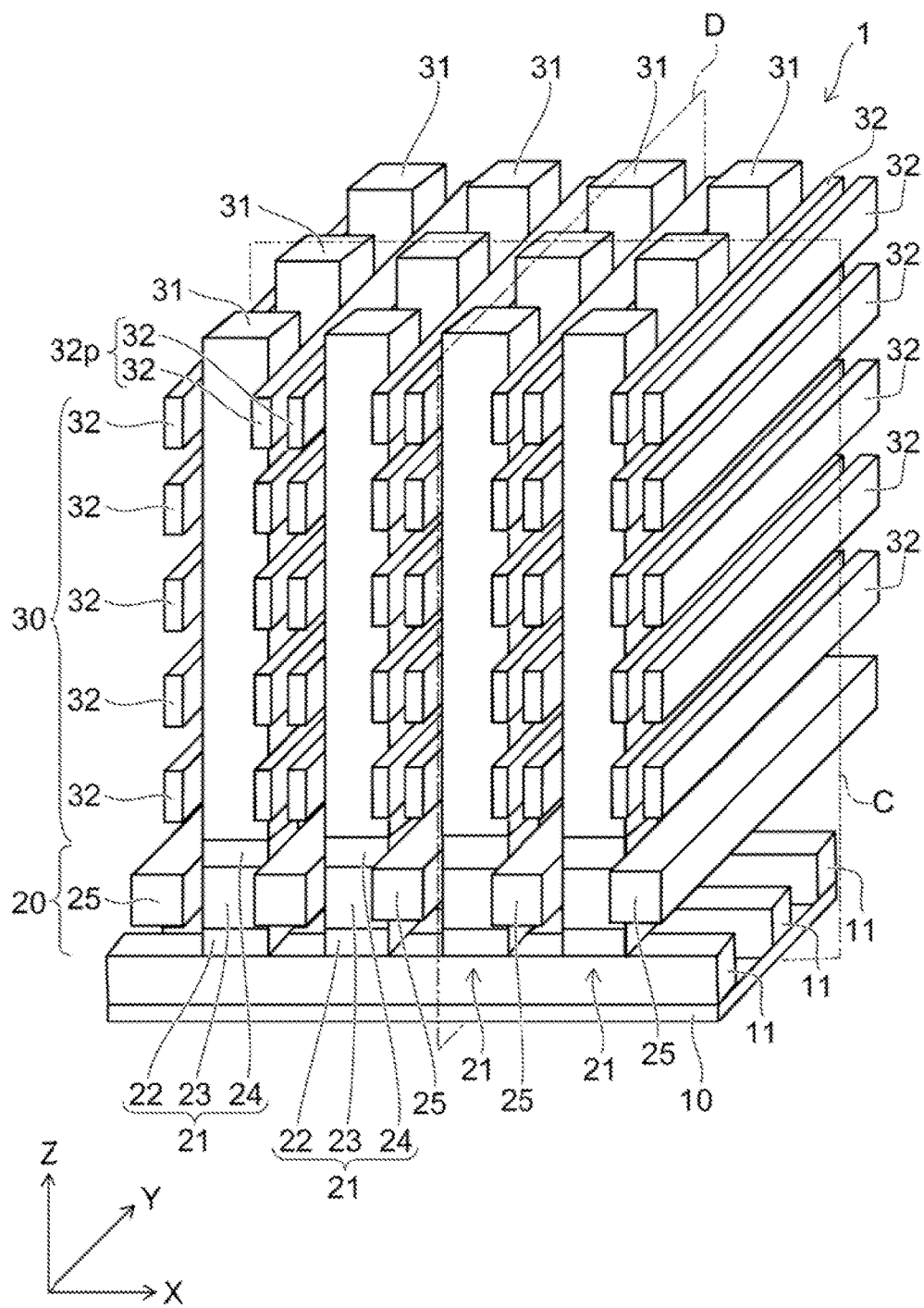
FIG. 1 is a perspective view showing a memory device according to a first embodiment.

FIG. 1 is a perspective view showing a memory device according to the embodiment.

Figure 2A:
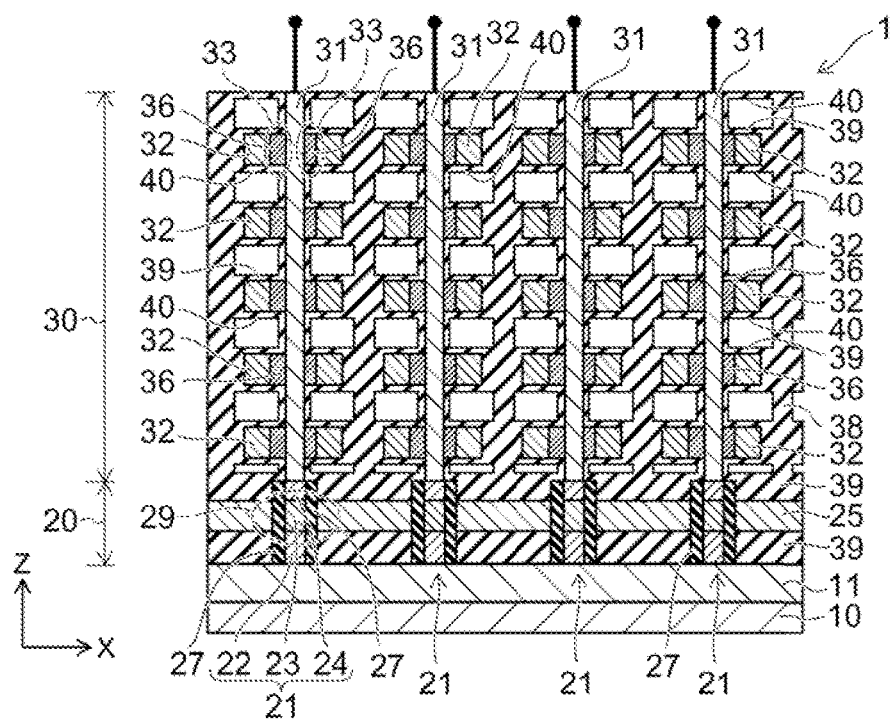
FIG. 2A and FIG. 2B are sectional views showing the memory device according to the first embodiment.
Figure 2B:
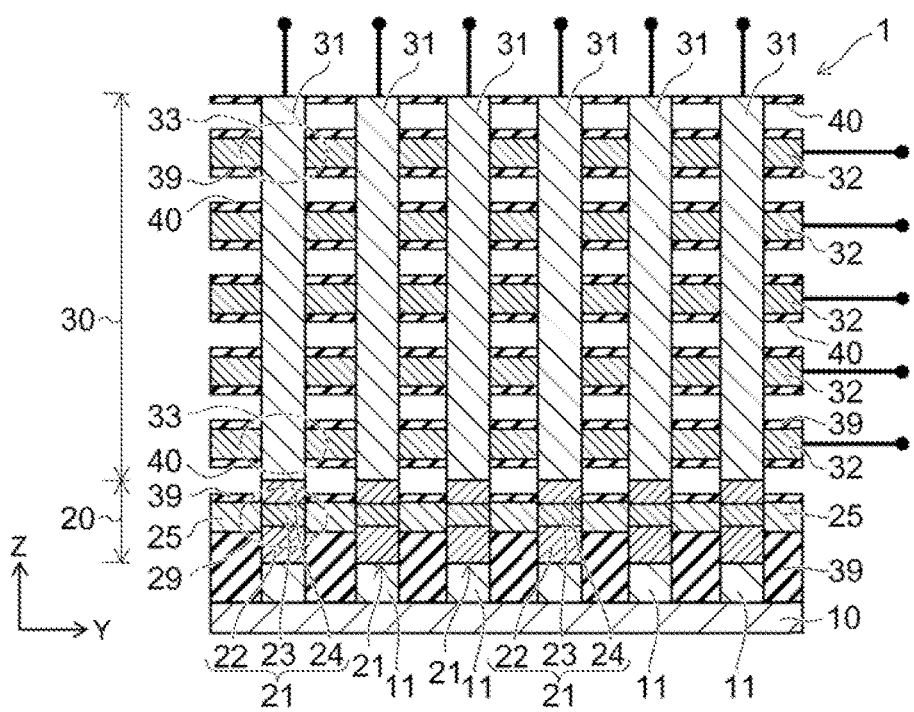

FIG. 2A and FIG. 2B are sectional views showing the memory device according to the embodiment. FIG. 2A shows the cross section of area C in FIG. 1 and FIG. 2B shows the cross section of area D in FIG. 1.

Figure 3:
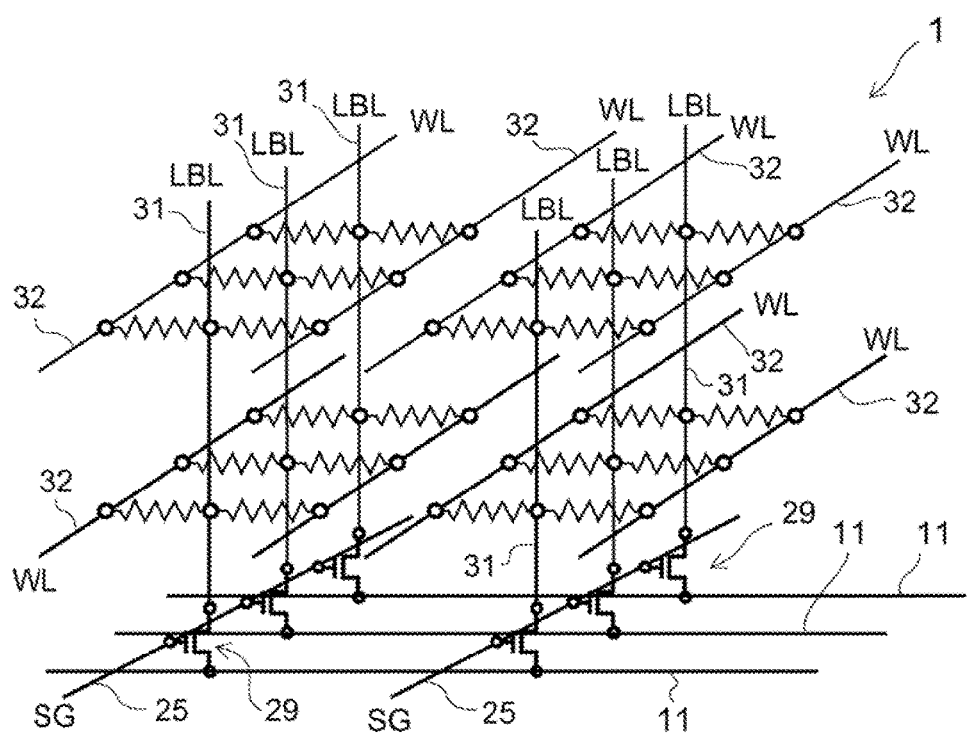
FIG. 3 is a schematic circuit diagram showing the memory device according to the first embodiment.

FIG. 3 is a schematic circuit diagram showing the memory device according to the embodiment.

Figure 4:
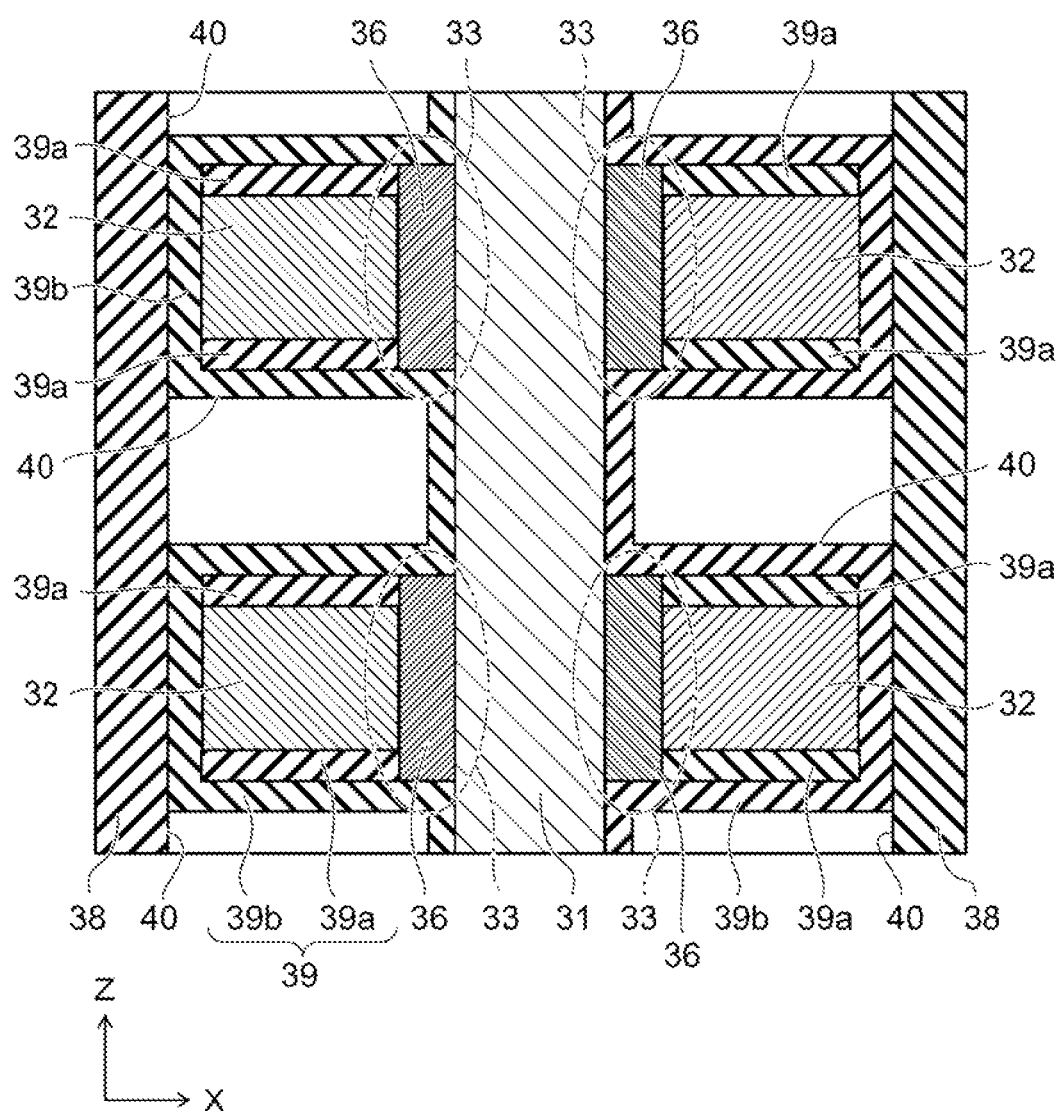
FIG. 4 is a sectional view showing memory cells of the memory device according to the first embodiment.

FIG. 4 is a sectional view showing memory cells of the memory device according to the embodiment.

Herein, for convenience of illustration, each unit is briefly illustrated in FIG. 1, FIG. 2A and FIG. 2B. Further, FIG. 2B shows a YZ plane including local bit lines 31. Interlayer insulation films 39 existing in the front side are omitted in FIG. 2B in order to show gate electrodes 25 and local word lines 32. In the drawing, side faces of both the gate electrodes 25 and the local word lines 32 are shown with hatching so as to be easily seen. The same is true for the case of FIG. 8B to be described later.

The memory device according to the embodiment is a phase change random access memory (PCRAM).

As shown in FIG. 1, FIG. 2A, FIG. 2B, and FIG. 3, the memory device 1 according to the embodiment is provided with a silicon substrate 10.

Hereinafter, for convenience of description, in the specification, XYZ orthogonal coordinate system is used. Two directions which are in parallel to the top face of the silicon substrate 10 and also are orthogonal to each other, correspond to "the X direction" and "the Y direction", respectively, and a direction which is normal to the top face of the silicon substrate 10 corresponds to "the Z direction".

A plurality of global bit lines 11 extending in the X direction are provided on the silicon substrate 10. The plurality of global bit lines 11 are periodically arranged in the Y direction. The global bit lines 11 are formed such that, for example, the upper layer portion of the silicon substrate 10 is divided by element separating insulators (not shown), or the global bit lines 11 is formed of polysilicon on an insulation film (not shown) which is provided on the silicon substrate 10. Wiring selecting units 20 are provided over the global bit lines 11, and memory units 30 are provided over the wiring selecting units 20.

A plurality of semiconductor members 21 is provided in the wiring selecting unit 20. The plurality of semiconductor members 21 are arranged in a matrix-like shape in the X direction and the Y direction, and each semiconductor member 21 extends in the Z direction. Further, the plurality of semiconductor members 21 which is arranged in a row in the X direction are commonly connected to one global bit line 11. In each semiconductor member 21, starting from the low side, i.e., starting from the global bit lines 11, an $n^+$ type portion 22, a $p^-$ type portion 23 and an $n^+$ type portion 24 are sequentially arranged in the order listed in the Z direction. Alternatively, the position of the n type portion and the p type portion may be reversed.

The gate electrodes 25 extending in the Y direction are provided between each semiconductor member 21 in the X direction. The gate electrodes 25 are at the same level in the Z direction. Further, as viewed in the X direction, the gate electrode 25 overlaps the upper portion of the $n^+$ type portion 22, the entire $p^-$ type portion 23 and the lower part of the $n^+$ type portion 24. A gate insulation film 27 formed of, for example, silicon oxide is provided between the semiconductor member 21 and the gate electrodes 25. A thin film transistor (TFT) 29 of an n channel type includes the semiconductor member 21, the gate insulation film 27, and the gate electrode 25.

The memory unit 30 is provided with a plurality of local bit lines 31. The plurality of local bit lines 31 are arranged in a matrix-like shape in the X direction and the Y direction, and each local bit line 31 extends in the Z direction. The local bit line 31 is formed of, for example, metallic material such as tungsten (W). Further, the lower end of each local bit line 31 connects to the upper end of each semiconductor member 21. Accordingly, each local bit line 31 connects to the global bit line 11 through each semiconductor member 21.

The local word lines 32 are provided between adjacent local bit lines 31 in the X direction. The local word lines 32 extend in the Y direction, are arranged in two rows on sides of the local bit lines 31 in the X direction, and are arranged in plural stages in the Z direction. In other words, in an XZ cross section, one local bit line 31 and two rows of local word lines 32 are alternately arranged in the X direction. The local word line 32 includes a main body unit formed of, for example, tungsten, and a barrier metal layer formed of, for example, titanium nitride (TiN) which covers a surface of the main body unit.

As shown in FIG. 2A and FIG. 4, a variable resistance film 36 is provided between the local bit line 31 and the local word line 32. The variable resistance film 36 contacts both the local bit line 31 and the local word line 32, and is also connected between the local bit line 31 and the local word line 32. The variable resistance film 36 is, for example, a phase change film which is, for example, a super lattice film formed of germanium-antimony-tellurium (GeSbTe). More specifically, the variable resistance film 36 corresponds to, a super lattice film in which, for example, an $Sb_2Te_3$ layer and a GeTe layer are alternately stacked so as to achieve a super lattice property as a result. A memory cell 33 includes a variable resistance film 36, a local bit line 31 and a local word line 32, but herein, the local bit line 31 and the local word line 32 connect to the variable resistance film 36.

Interlayer insulation films 39 formed of, for example, silicon oxide are provided on the surfaces of the local bit line 31, the local word line 32 and the variable resistance film 36. Further, a plate-like insulation member 38 which becomes widened along the YZ plane is provided between the adjacent local word lines 32 in the X direction. The insulation member 38 is formed of, for example, silicon oxide. A cavity may be formed in the insulation member 38. In addition, air gaps 40 extending in the Y direction are formed between the adjacent local word lines 32 in the Z direction. In other words, two adjacent local word lines 32 in the X direction and two adjacent air gaps 40 in the X direction are arranged between the two adjacent local bit lines 31 in the X direction. Further, the insulation member 38 is arranged between the two adjacent local word lines 32 in the X direction and between the two adjacent air gaps 40 in the X direction.

Hereinafter, an operation of the memory device according to the embodiment will be described.

Figure 5A:
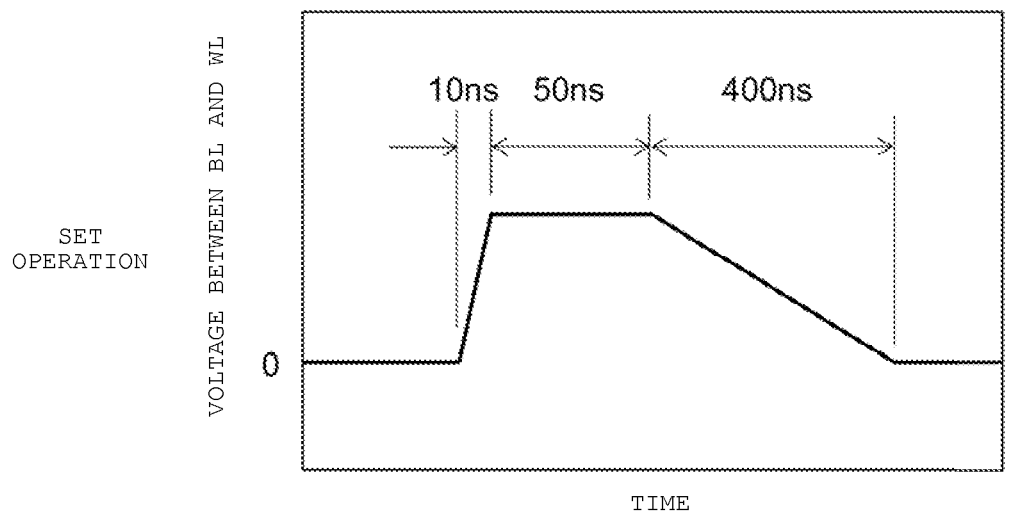
FIG. 5A and FIG. 5B are graphs in which the horizontal axis indicates time and the vertical axis indicates voltage, showing driving signals of the memory device according to the first embodiment.
Figure 5B:
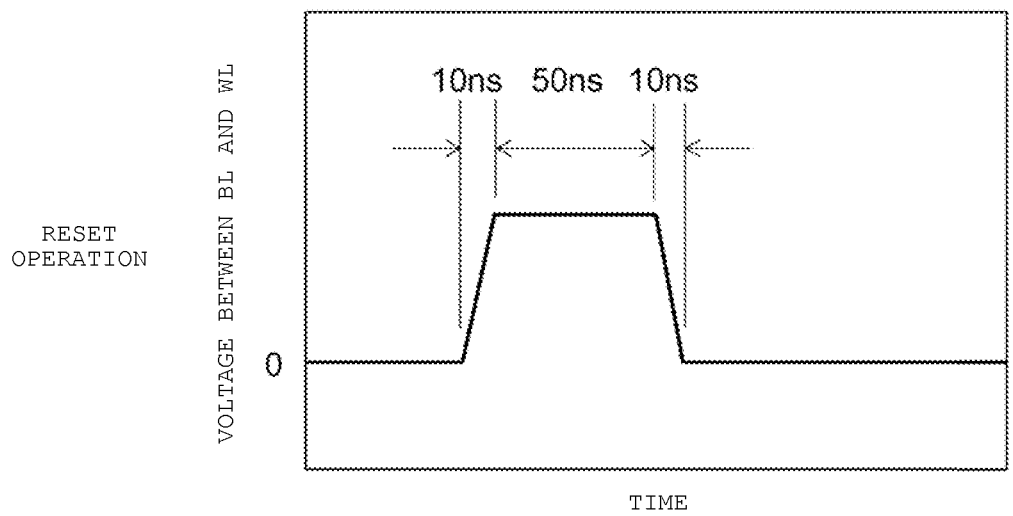

FIG. 5A and FIG. 5B are graphs in which the horizontal axis indicates time and the vertical axis indicates voltage, showing driving signals of the memory device according to the embodiment, and FIG. 5A shows a set operation and FIG. 5B shows a reset operation.

FIG. 5A depicts a transition operation where the variable resistance film 36 is transitioned from a high resistance state to a low resistance state. That is, in a set operation, a set voltage, in which the local bit line 31 acts as a positive pole and the local word line 32 acts as a negative pole with respect to the variable resistance film 36, is increased up to a predetermined voltage, for example, for 10 ns (nano seconds). Further, after the predetermined voltage is applied, for example, for 50 ns, and the voltage is decreased down to zero, for example, for 400 ns. Accordingly, the variable resistance film 36 is heated and then is slowly cooled, and thus the variable resistance film 36 remains in the low resistance state.

On the other hand, FIG. 5B depicts a transition operation where the variable resistance film 36 is transitioned from a low resistance state to a high resistance state. That is, in a reset operation, a reset voltage, in which the local bit line 31 acts as a positive pole and the local word line 32 acts as a negative pole with respect to the variable resistance film 36, is increased up to a predetermined voltage, for example, for 10 ns. Further, after the predetermined voltage is applied, for example, for 50 ns, the voltage is decreased down to zero, for example, for 10 ns. According to the measure, the variable resistance film 36 is heated and then is rapidly cooled. Therefore, the variable resistance film 36 returns to the high resistance state.

Hereinafter, a manufacturing method of the memory device according to the embodiment will be described.

FIG. 6A to FIG. 6C and FIG. 7A to FIG. 7C are sectional views showing a manufacturing method of the memory device according to the embodiment.

Firstly, as shown in FIG. 1, FIG. 2A and FIG. 2B, according to a typical method, a plurality of global bit lines 11 are formed on the silicon substrate 10, and the wiring selecting unit 20 is formed on the global bit lines 11.

Figure 6A:
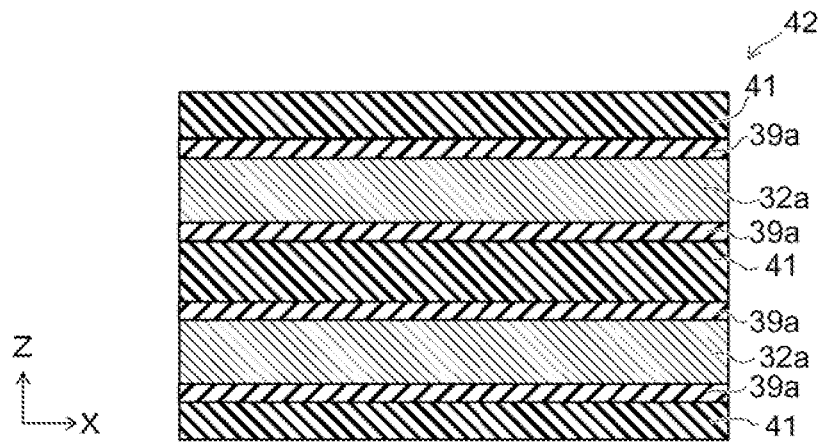
FIG. 6A to FIG. 6C are sectional views showing a manufacturing method of the memory device according to the first embodiment.

Subsequently, as shown in FIG. 6A, a silicon nitride film 41, a silicon oxide film 39a, a tungsten film 32a and a silicon oxide film 39a are repeatedly stacked so as to form a stacked layer body 42 on the wiring selecting unit 20.

Figure 6B:
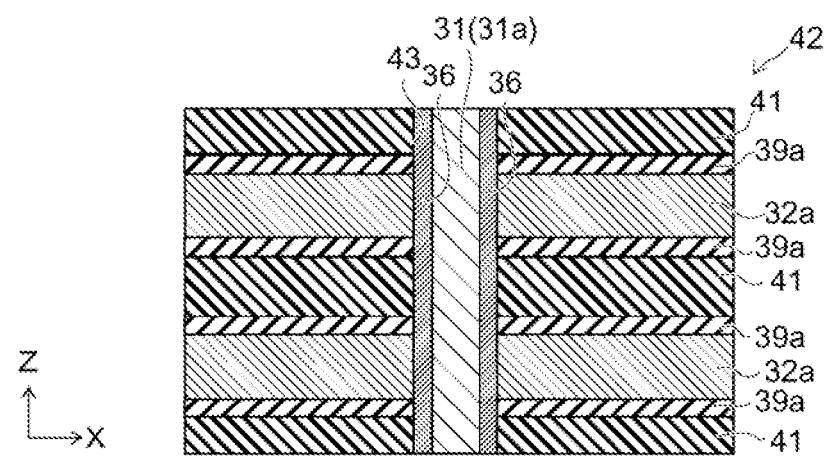

As shown in FIG. 6B, anisotropy etching such as reactive ion etching (RIE) is performed with respect to the stacked layer body 42 so as to form slits 43 which become widened along the YZ plane. Plural slits 43 are formed at equal intervals in the X direction. Subsequently, the variable resistance film 36 is formed on the internal face of the slit 43. The variable resistance film 36 is, for example, a super lattice film formed of germanium-antimony-tellurium (GeSbTe). Subsequently, tungsten is deposited on the variable resistance film 36 in order for a tungsten film 31a to be formed and cause the internal portion of the slit 43 to be filled.

Subsequently, for example, a lithography method is used to divide the variable resistance film 36 and the tungsten film 31a in the slit 43 in the Y direction. Accordingly, a plurality of local bit lines 31 is formed for each slit 43. Herein, the plurality of local bit lines 31 is formed of tungsten and is arranged to be spaced with each other in the Y direction. The variable resistance film 36 remains on the two side faces of the local bit line 31 facing opposite directions in the X direction. Subsequently, silicon oxide (not shown) is used to fill a gap between the local bit lines 31 in the slit 43 in the Y direction.

Figure 6C:
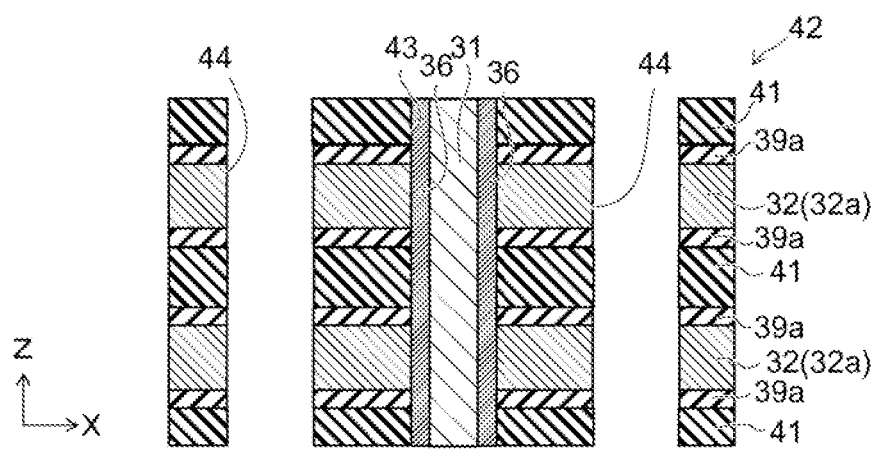

Subsequently, as shown in FIG. 6C, for example, an RIE is performed to form slits 44 which become widened along the YZ plane, in a portion of the stacked layer body 42 between slits 43. Accordingly, the slit 43 and the slit 44 divide a tungsten film 32a in the X direction into a plurality of local word lines 32.

Figure 7A:
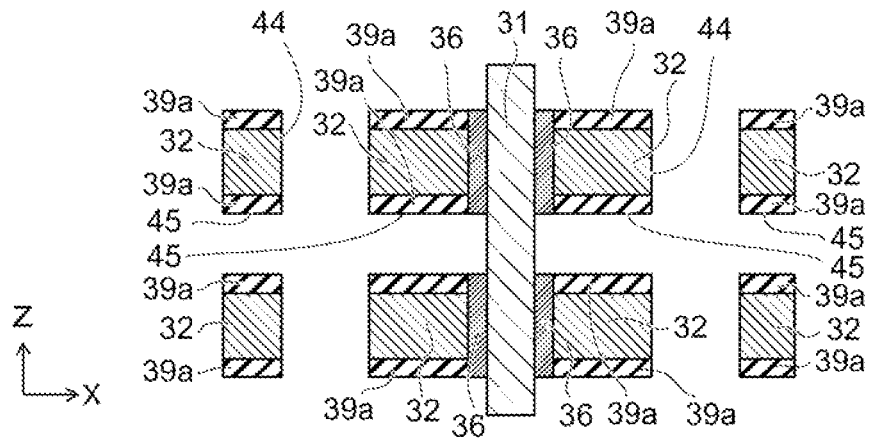
FIG. 7A to FIG. 7C are sectional views showing a manufacturing method of the memory device according to the first embodiment.

Subsequently, as shown in FIG. 7A, isotropic etching is performed through the slit 44 to cause the silicon oxide film 39a and the local word line 32 to remain and remove the silicon nitride film 41. For example, a wet etching in which thermal phosphoric acid is used as an etching solution is performed. Accordingly, a recess 45 is formed in an area between adjacent silicon oxide films 39a into the side faces of the slits 44 in the Z direction. A portion of the variable resistance film 36 is exposed to a deepest end of the recess 45. Further, the etching is used to remove the exposed portion of the variable resistance film 36 at the deepest end of the recess 45 and thus the recess 45 is formed through the variable resistance film 36. Accordingly, the variable resistance film 36 is divided in the Z direction. Further, the local bit line 31 and the silicon oxide (not shown) are exposed to the deepest end of the recess 45.

Figure 7B:
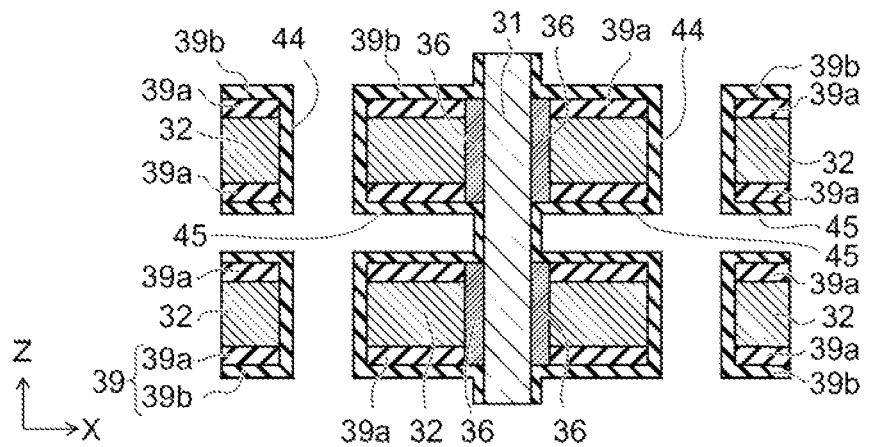

Subsequently, as shown in FIG. 7B, the silicon oxide is deposited through the slit 44. Accordingly, the silicon oxide film 39b is formed on the slit 44 and the internal face of the recess 45. However, the silicon oxide film 39b is formed so as to not completely fill the slit 44 and the recess 45. The silicon oxide films 39a and 39b make up the interlayer insulation film 39.

Figure 7C:
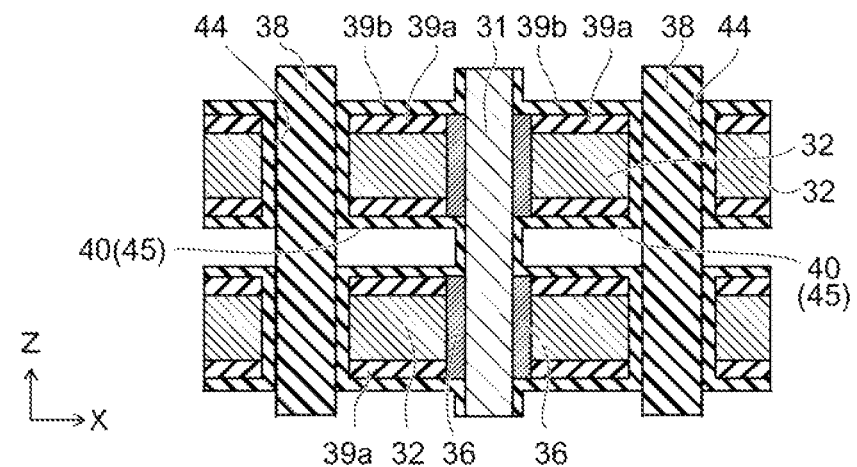

Subsequently, as shown in FIG. 7C, an insulation member 38 formed of, for example, silicon oxide is formed in the slit 44. A cavity may be formed in the insulation member 38. Further, the insulation member 38 is formed so as to not to completely fill the internal portion of the recess 45. A space in the recess 45 is surrounded by the interlayer insulation film 39 and the insulation member 38, and corresponds to the air gap 40. Accordingly, the memory device 1 according to the embodiment is manufactured.

Hereinafter, the effect of the embodiment will be described.

As shown in FIG. 2A, FIG. 2B and FIG. 4, in the memory device 1 according to the embodiment, the air gap 40 is formed between the adjacent local word lines 32 in the Z direction. For this reason, transfer of heat between the memory cells 33 may be suppressed and interference between the memory cells 33 may be suppressed. Accordingly, when a plurality of memory cells 33 arranged in an area is continuously accessed, the operation of other memory cells 33 may be stabilized. If the interference between the memory cells 33 is suppressed, miniaturization of the memory device 1 can be more easily achieved.

Further, since the variable resistance film 36 is a super lattice film in the memory device 1 according to the embodiment, a small amount of current may cause the phase change to be generated. For this reason, the miniaturization of the memory device and saving of electrical power may be more easily achieved. In this case, the variable resistance film 36 has conductivity. However, in the embodiment, since the variable resistance film 36 is divided between the adjacent memory cells 33 in the Z direction, the electrical interference between memory cells 33 is suppressed.

As such, according to the embodiment, a memory device in which the interference between the memory cells is suppressed may be manufactured.

Second Embodiment

Hereinafter, the second embodiment will be described.

Figure 8A:
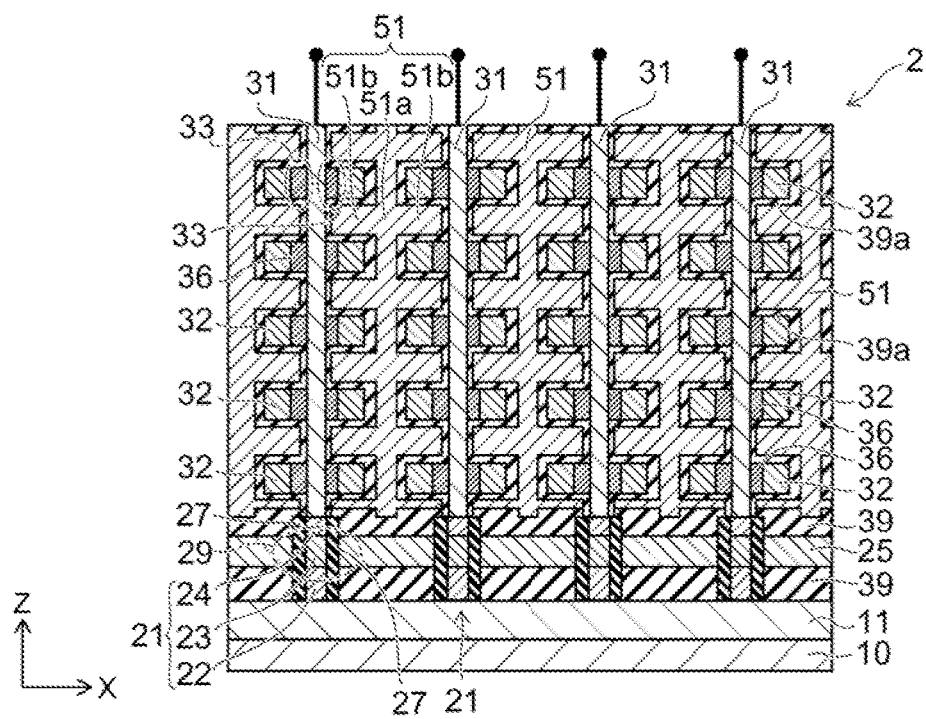
FIG. 8A and FIG. 8B are sectional views showing a memory device according to a second embodiment.
Figure 8B:
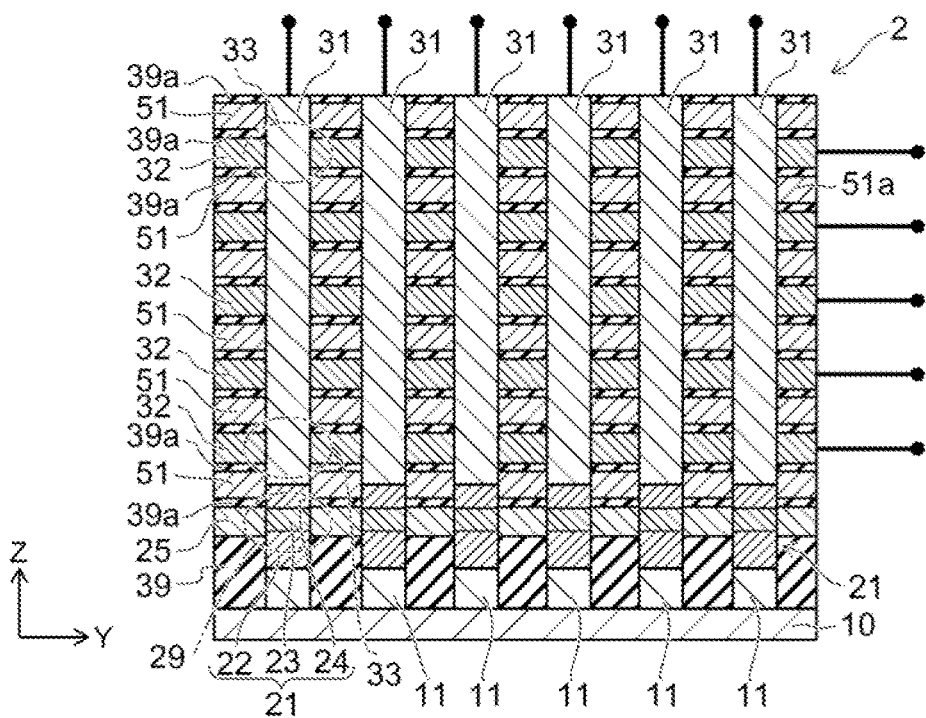

FIG. 8A and FIG. 8B are sectional views showing a memory device according to the embodiment.

Figure 9:
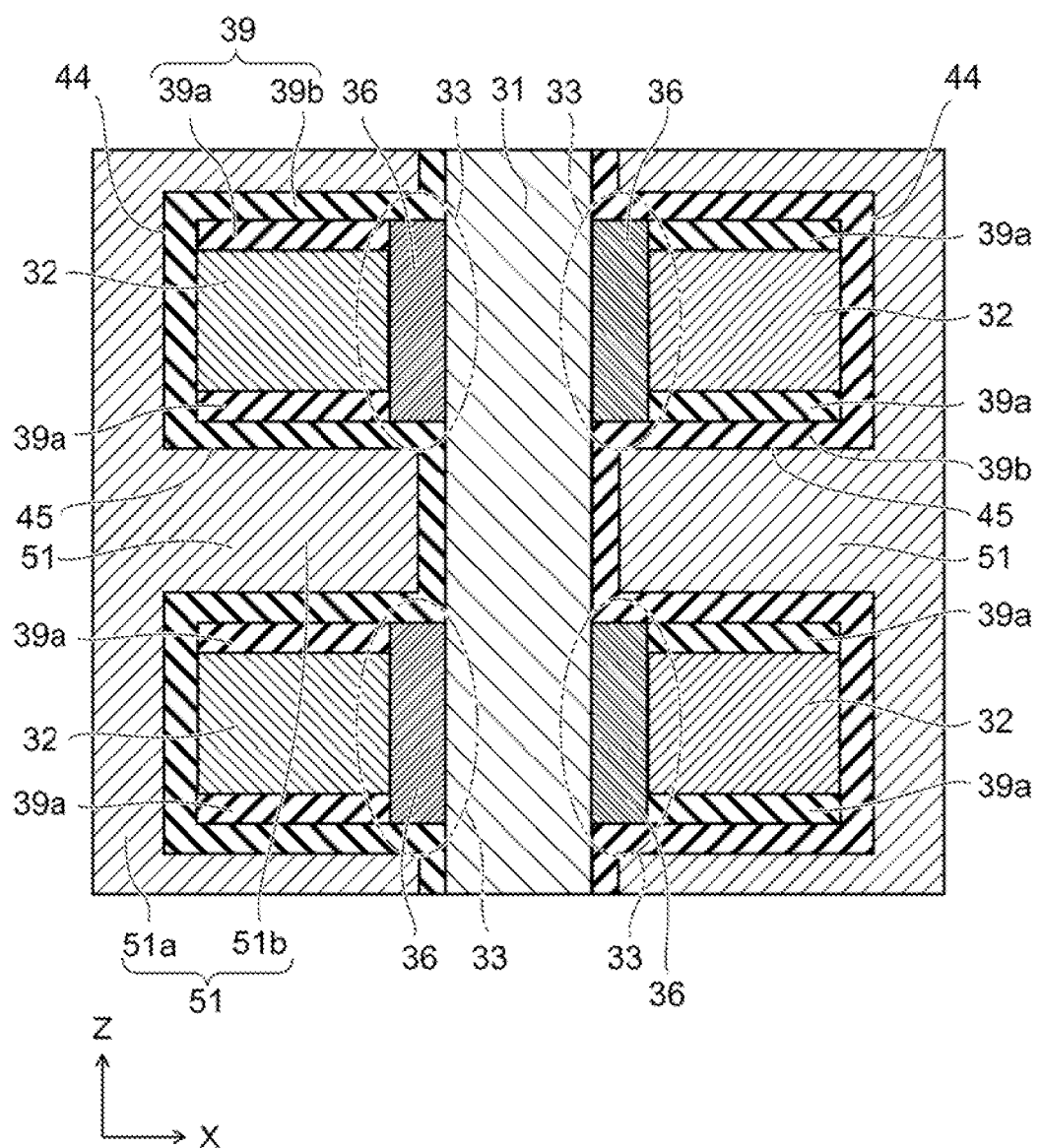
FIG. 9 is a sectional view showing memory cells of the memory device according to the second embodiment.

FIG. 9 is a sectional view showing memory cells of the memory device according to the embodiment.

As shown in FIG. 8A, FIG. 8B and FIG. 9, the memory device 2 according to the embodiment is different from the memory device 1 (see FIG. 1 to FIG. 4) according to the first embodiment described above in that a conductive material, for example, a metallic material, for example, tungsten or aluminum is embedded in the slit 44 and in the recess 45, and heat conducting wirings 51 are formed of the conductive material. The heat conducting wiring 51 is insulated by the interlayer insulation film 39 from the local bit line 31 and the local word line 32 so as to be electrically isolated from the other wirings of the memory device 2. However, when the silicon substrate 10 is insulated from the global bit line 11, the heat conducting wiring 51 may connect to the silicon substrate 10.

In the heat conducting wiring 51, a plate-like portion 51a and an extension portion 51b are provided. The plate-like portion 51a is arranged between two adjacent local word lines 32 in the X direction, and becomes widened in a plate-like shape along the Y direction and the Z direction. The extension portion 51b extends from the plate-like portion 51a in the X direction, and is arranged between the adjacent local word lines 32 in the Z direction.

The memory device 2 according to the embodiment may be manufactured such that, after processes shown in FIG. 6A to FIG. 7B are performed, the conductive material is embedded in the recess 45 and the slit 44, through the slit 44. Further, a cavity may be formed in the heat conducting wiring 51.

Hereinafter, the effect of the embodiment will be described.

In the embodiment, the heat conducting wiring 51 which is electrically insulated from the other wirings is provided in the memory device 2. Accordingly, the heat generated due to the operation of the memory cell is radiated out through the heat conducting wiring 51. For example, when the heat conducting wiring 51 connects to the silicon substrate 10, the heat is discharged outside through the silicon substrate 10. Further, when the heat conducting wiring 51 is drawn out to the upward portion of the memory device 2 and connects to a heat sink, a heat conducting plate or the like, the heat is discharged to these members. For this reason, the memory device 2 has excellent heat radiation property.

In the embodiment, the configuration, the operation, the manufacturing method and the effect other than the description described above are the same as those of the first embodiment.

Third Embodiment

Hereinafter, the third embodiment will be described.

Figure 10:
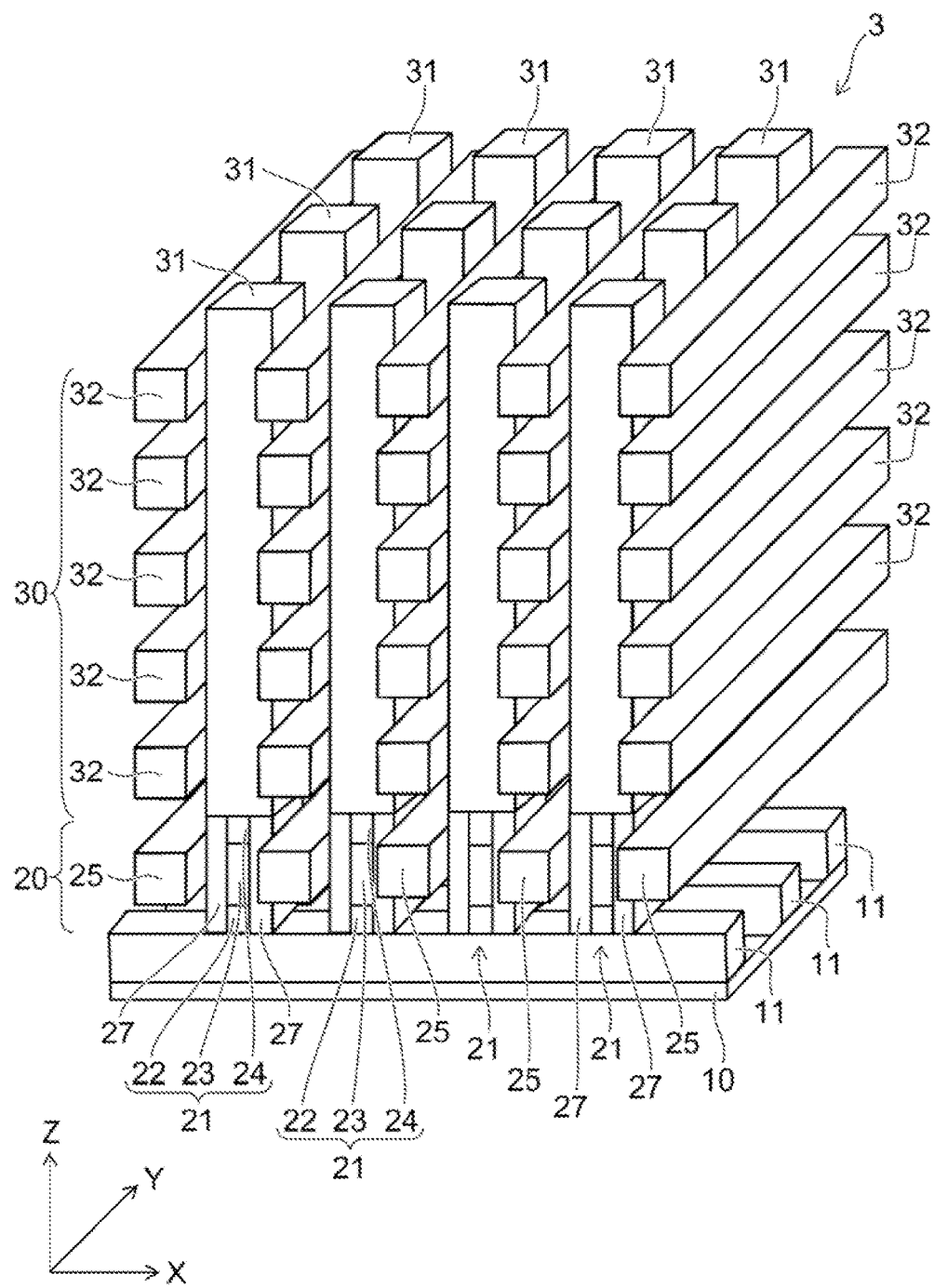
FIG. 10 is a perspective view showing a memory device according to a third embodiment.

FIG. 10 is a perspective view showing a memory device according to the embodiment.

Figure 11A:
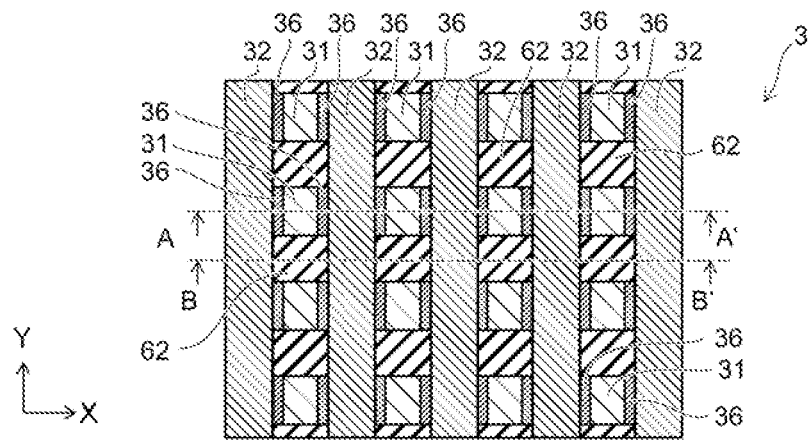
FIG. 11A is a plan view showing the memory device according to the third embodiment.
Figure 11B:
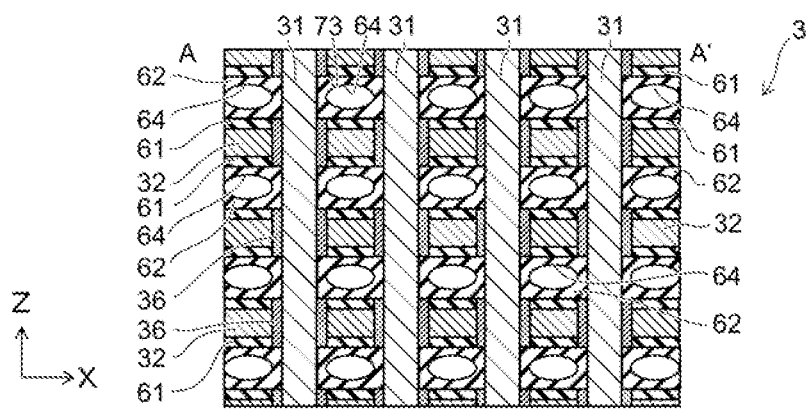
FIG. 11B is a sectional view taken along line A-A' in FIG. 11A.
Figure 11C:
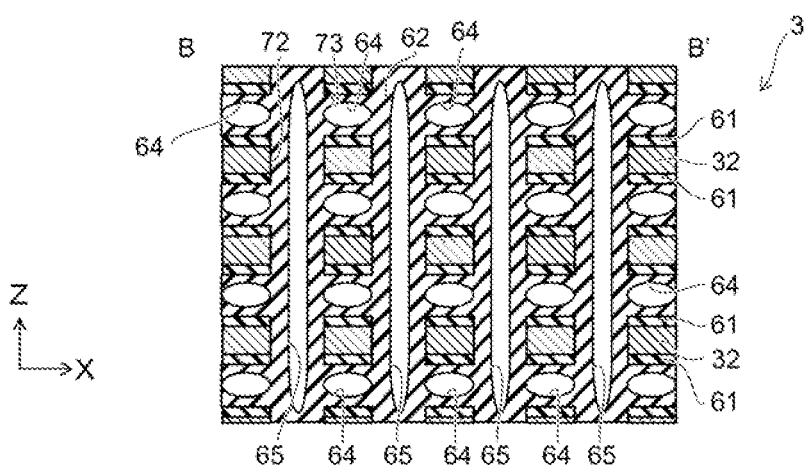
FIG. 11C is a sectional view taken along line B-B' in FIG. 11A.

FIG. 11A is a plan view showing the memory device according to the embodiment, FIG. 11B is a sectional view taken along line A-A' in FIG. 11A, and FIG. 11C is a sectional view taken along line B-B' in FIG. 11A.

Figure 12:
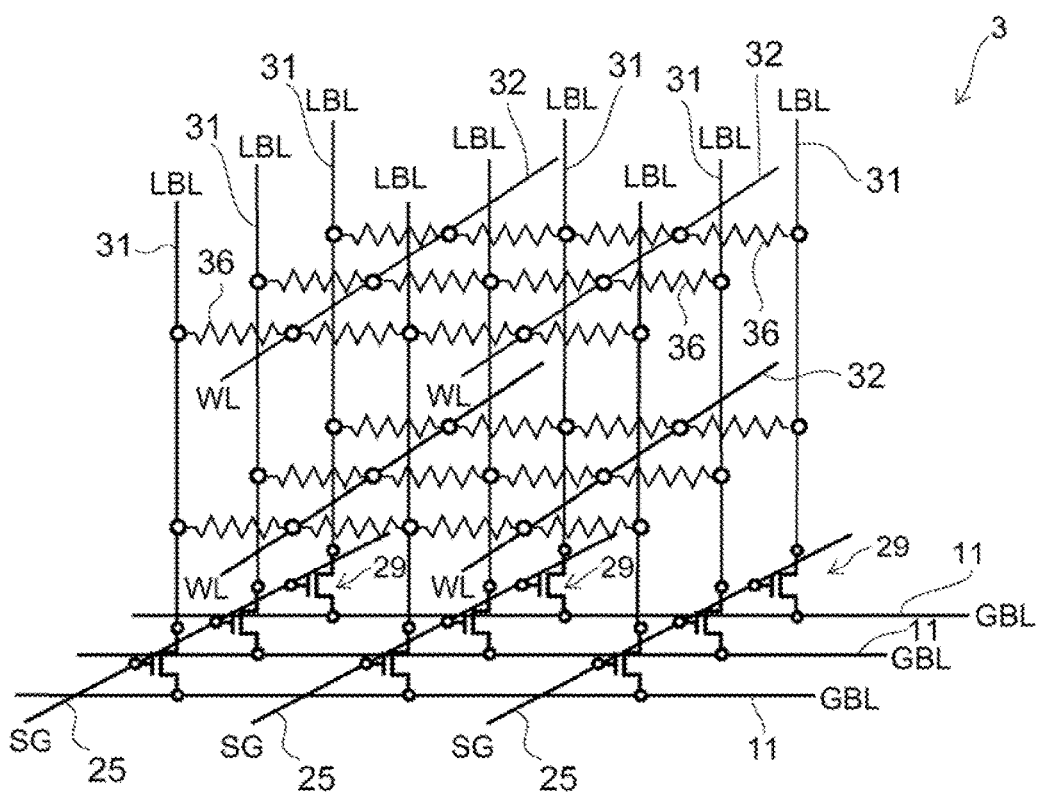
FIG. 12 is a schematic circuit diagram showing the memory device according to the third embodiment.

FIG. 12 is a schematic circuit diagram showing the memory device according to the embodiment.

As shown in FIG. 10, FIG. 11A to FIG. 11C, and FIG. 12, the memory device 3 according to the embodiment is different from the memory device 1 (see FIG. 1 to FIG. 4) according to the first embodiment in a configuration of the memory unit 30. In other words, in the memory device 3, the local word line 32 extending in the Y direction is arranged in multiple rows along the Z direction between two adjacent local bit lines 31 in the X direction. Accordingly, in a certain XZ cross section, the local bit line 31 and the local word line 32 are alternately arranged in the X direction. Further, the variable resistance film 36 is provided between the local bit line 31 and the local word line 32. The variable resistance film 36 is, for example, a super lattice film formed of GeSbTe. The variable resistance films 36 are divided and are arranged between the local bit line 31 and the local word line 32 in a matrix-like shape in the Y direction and the Z direction.

An insulation film 61 formed of, for example, silicon oxide is provided on the top face and the bottom face of the local word line 32. Further, an interlayer insulation film 62 formed of, for example, silicon oxide is provided so as to cover the local bit line 31, the local word line 32, the insulation film 61 arranged on the top faces and the bottom faces of the local word line 32, and the variable resistance film 36.

Further, air gaps 64 extending in the Y direction are formed between the adjacent local word lines 32 in the Z direction in the interlayer insulation film 62. Further, air gaps 65 extending in the Z direction are formed between the adjacent local bit lines 31 in the Y direction in the interlayer insulation film 62. In the examples shown in FIG. 11B and FIG. 11C, the air gap 64 and the air gap 65 do not communicate with each other. However, in alternative embodiments, at least a part of the air gap 64 and at least a part of the air gap 65 may communicate with each other.

Hereinafter, a manufacturing method of the memory device according to the embodiment will be described.

FIG. 13A to FIG. 13C, FIG. 14A to FIG. 14C, FIG. 15A to FIG. 15C and FIG. 16A to FIG. 16C are views showing manufacturing methods of the memory device according to the embodiment. FIG. 13A, FIG. 14A, FIG. 15A and FIG. 16A are plan views, FIG. 13B, FIG. 14B, FIG. 15B and FIG. 16B are sectional views taken along lines A-A' in FIG. 13A, FIG. 14A, FIG. 15A and FIG. 16A, and FIG. 13C, FIG. 14C, FIG. 15C and FIG. 16C are sectional views taken along lines B-B' in FIG. 13A, FIG. 14A, FIG. 15A and FIG. 16A.

Firstly, as shown in FIG. 10, according to a typical method, a plurality of global bit lines 11 is formed on the silicon substrate 10, and the wiring selecting unit 20 is formed on the global bit lines 11.

Figure 13A:
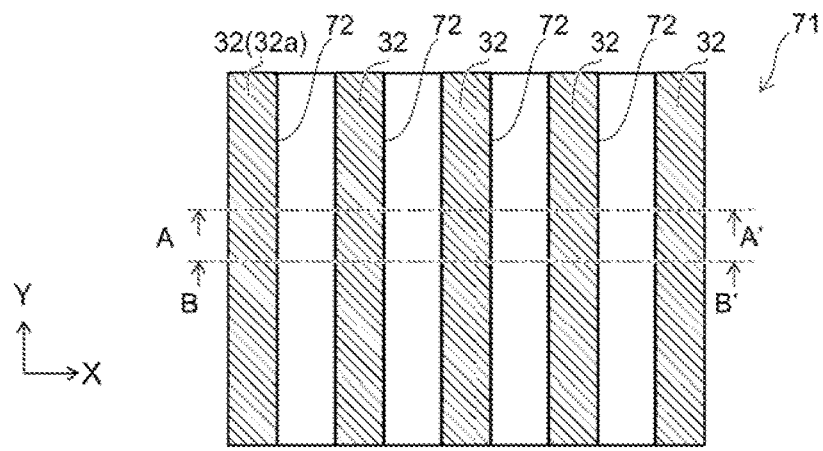
FIG. 13A is a plan view showing a manufacturing method of the memory device according to the third embodiment.
Figure 13B:
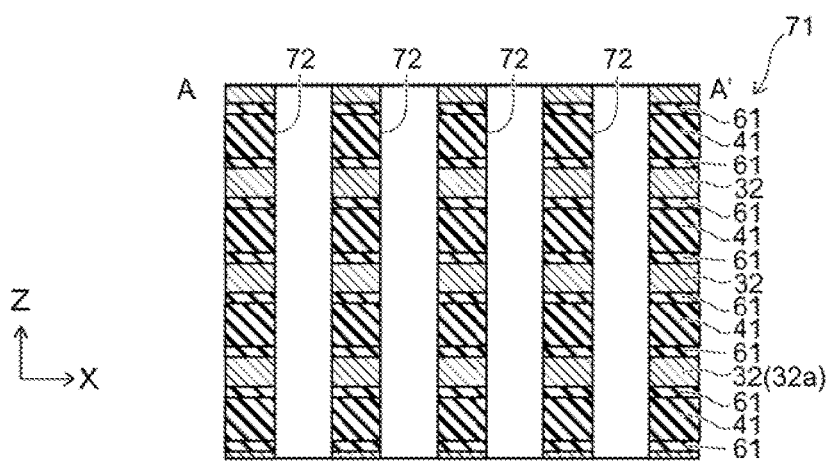
FIG. 13B is a sectional view taken along line A-A' in FIG. 13A.
Figure 13C:
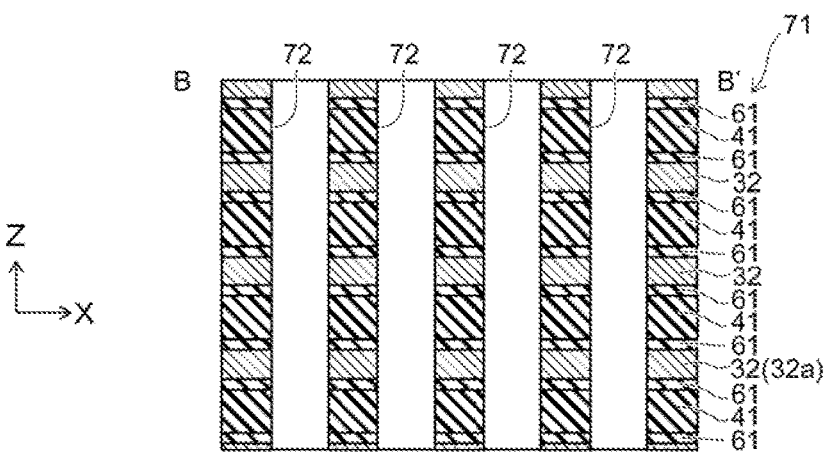
FIG. 13C is a sectional view taken along line B-B' in FIG. 13A.

Subsequently, as shown in FIG. 13A to FIG. 13C, a silicon nitride film 41, an insulation film 61 formed of, for example, silicon oxide, a tungsten film 32a and an insulation film 61 are repeatedly stacked so as to form a stacked layer body 71 on the wiring selecting unit 20. Subsequently, for example, anisotropy etching such as RIE is performed with respect to the stacked layer body 71 so as to form slits 72 which become widened along the YZ plane. Plural slits 72 are formed at equal intervals in the X direction. The slits 72 divide a tungsten film 32a into a plurality of local word lines 32.

Figure 14A:
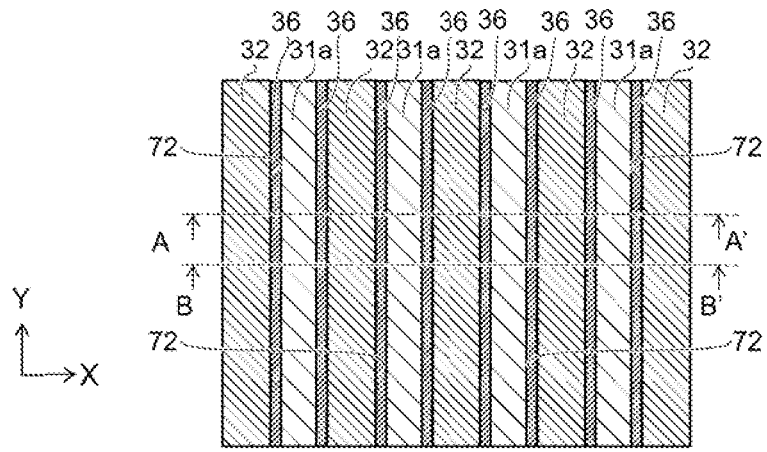
FIG. 14A is a plan view showing a manufacturing method of the memory device according to the third embodiment.
Figure 14B:
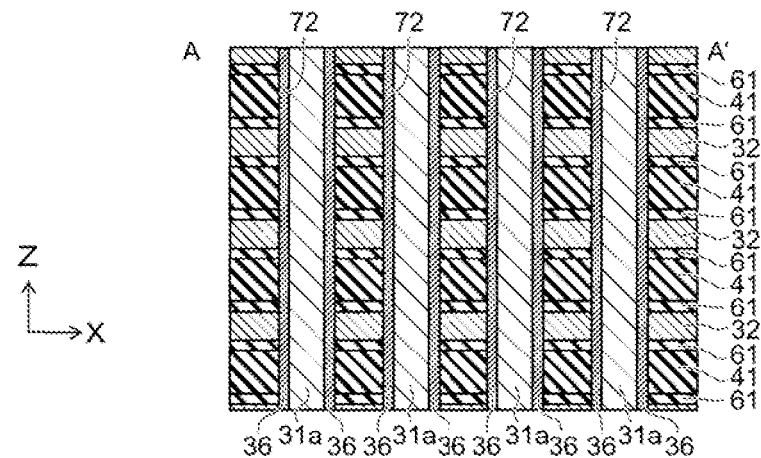
FIG. 14B is a sectional view taken along line A-A' in FIG. 14A.
Figure 14C:
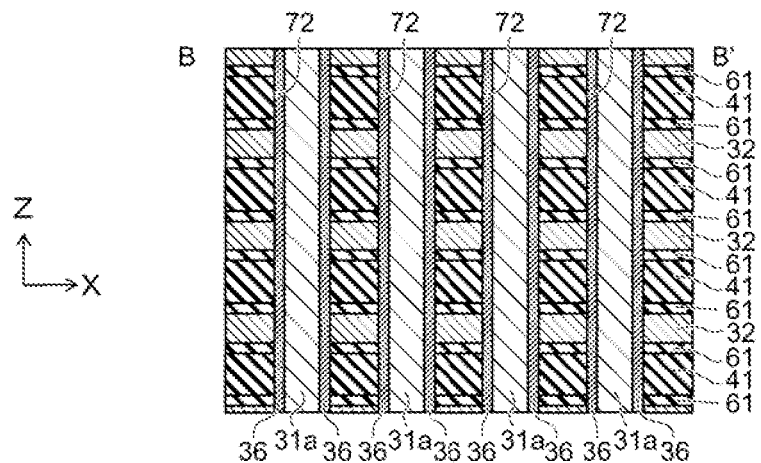
FIG. 14C is a sectional view taken along line B-B' in FIG. 14A.

Subsequently, as shown in FIG. 14A to 14C, the variable resistance film 36 is formed on the internal face of the slit 72. The variable resistance film 36 is, for example, a super lattice film formed of germanium-antimony-tellurium (GeSbTe). Subsequently, tungsten is embedded in the slit 72. Accordingly, the tungsten film 31a is formed in the slit 72.

Figure 15A:
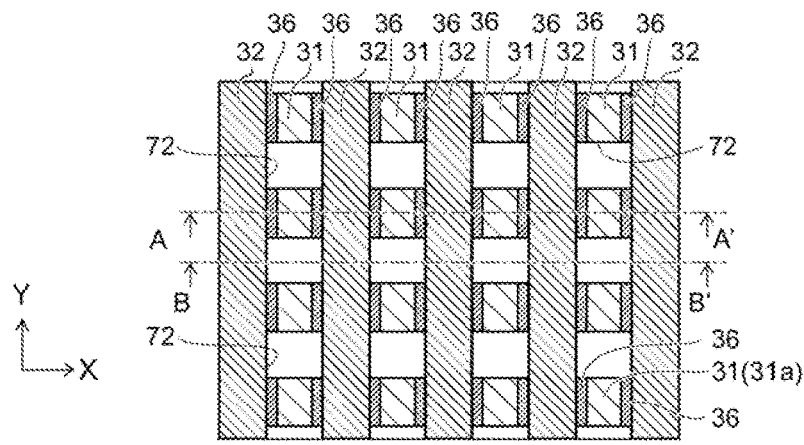
FIG. 15A is a plan view showing a manufacturing method of the memory device according to the third embodiment.
Figure 15B:
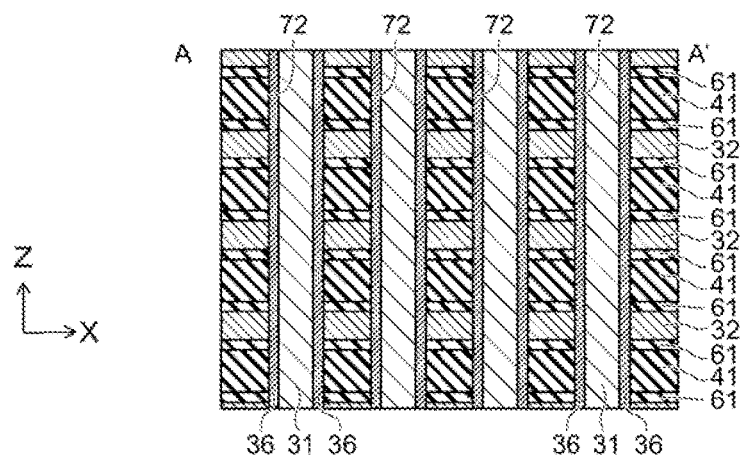
FIG. 15B is a sectional view taken along line A-A' in FIG. 15A.
Figure 15C:
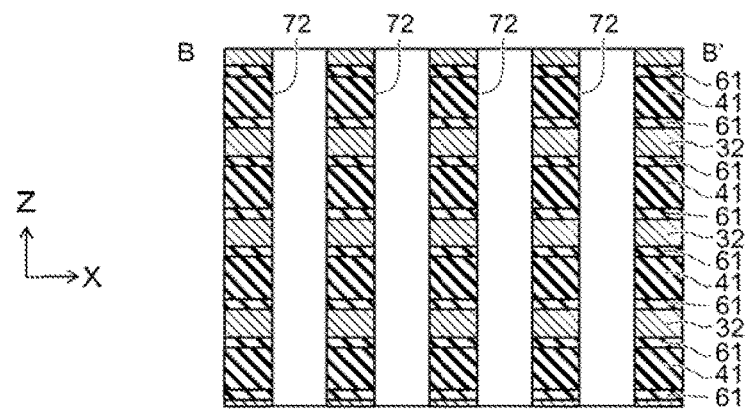
FIG. 15C is a sectional view taken along line B-B' in FIG. 15A.

Subsequently, as shown in FIG. 15A to FIG. 15C, for example, a lithography method is used on the variable resistance film 36 and the tungsten film 31a to divide the slit 72 separately in the Y direction. Accordingly, the tungsten film 31a is divided into a plurality of local bit lines 31. The variable resistance film 36 remains on the two side faces of the local bit line 31 facing opposite directions in the X direction.

Figure 16A:
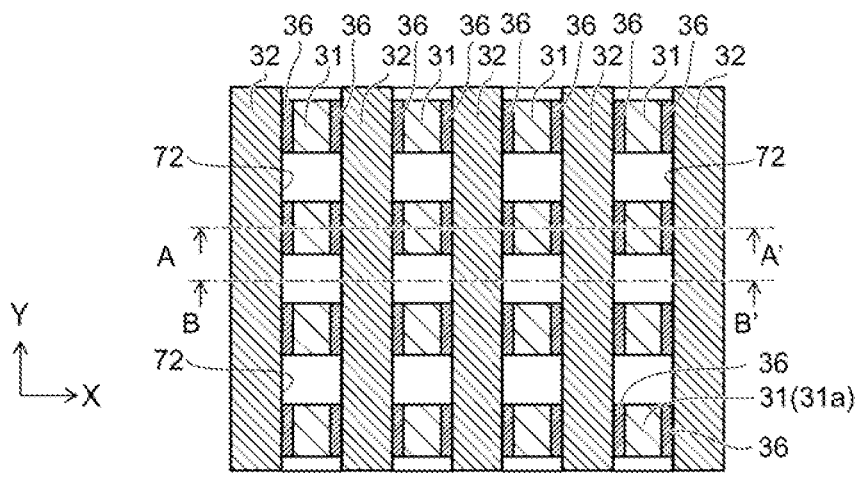
FIG. 16A is a plan view showing a manufacturing method of the memory device according to the third embodiment.
Figure 16B:
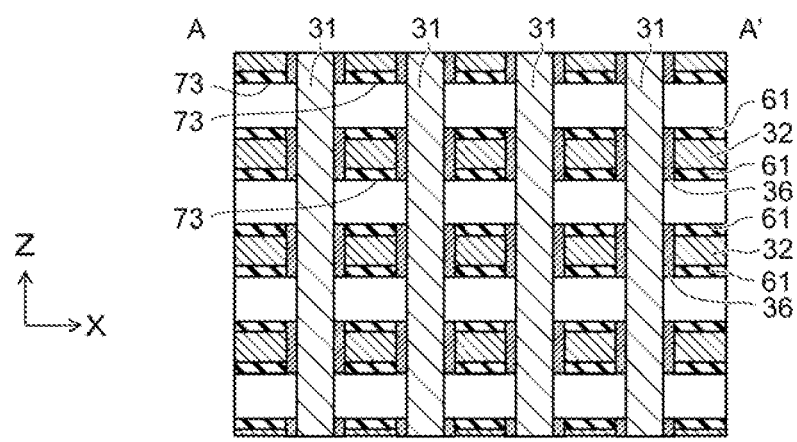
FIG. 16B is a sectional view taken along line A-A' in FIG. 16A.
Figure 16C:
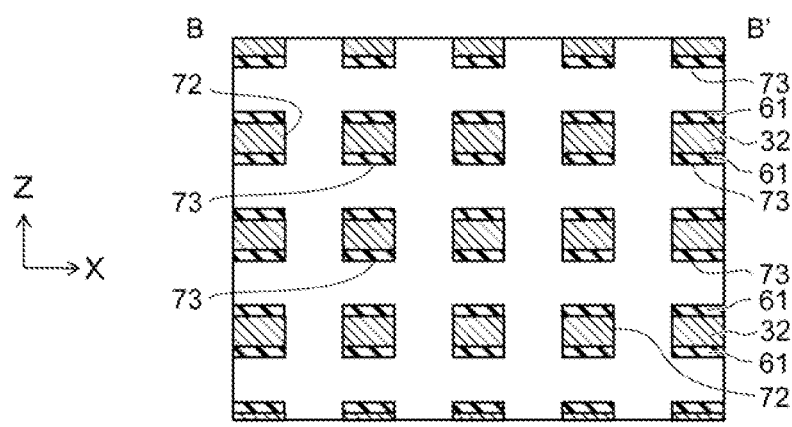
FIG. 16C is a sectional view taken along line B-B' in FIG. 16A.

Subsequently, as shown in FIG. 16A to FIG. 16C, for example, an isotropy etching such as a wet etching in which thermal phosphoric acid is used, is performed through a gap of the slit 72 between the local bit lines 31 so as to remove the silicon nitride film 41. Accordingly, a cavity 73 is formed between adjacent local word lines 32 in the Z direction in an area between adjacent slits 72 in the X direction. The cavity 73 communicates with the slit 72. A portion of the variable resistance film 36 is exposed to an internal face of the cavity 73. Subsequently, the etching is used to remove the exposed portion of the variable resistance film 36 through the slit 72 and the cavity 73. Accordingly, the variable resistance films 36 are divided in the Z direction and are arranged between the local bit line 31 and the local word line 32. On the other hand, the local bit line 31, the local word line 32 and the insulation film 61, and a portion of the variable resistance film 36 that are interposed between the local bit line 31 and the local word line 32 are not substantially etched and thus remain.

Subsequently, as shown in FIG. 11A to FIG. 11C, for example, a chemical vapor deposition (CVD) is used to cause insulation material such as silicon oxide to deposit on the internal faces of the slit 72 and the cavity 73. Accordingly, the interlayer insulation film 62 is embedded in the slit 72 and the cavity 73. In this case, the condition of CVD is selected so as to control coverage of the interlayer insulation film 62. Therefore, the air gap 64 is formed in a portion of the interlayer insulation film 62 arranged in the cavity 73 and the air gap 65 is formed in a portion of the interlayer insulation film 62 arranged in the silt 72. Accordingly, the memory device 3 according to the embodiment is manufactured.

Hereinafter, the effect of the embodiment will be described.

In the memory device 3 according to the embodiment 3, the air gaps 64 and 65 are formed in the interlayer insulation film 62. Accordingly, the interference generated by heat transfer between the memory cells 33 may be suppressed. As a result, the operation of the memory device 3 is stabilized and miniaturization of the memory device 3 may be more easily achieved.

In the embodiment, the configuration, the operation, the manufacturing method and the effect other than the description described above are the same as those of the first embodiment.

Fourth Embodiment

Subsequently, the fourth embodiment will be described.

Figure 17A:
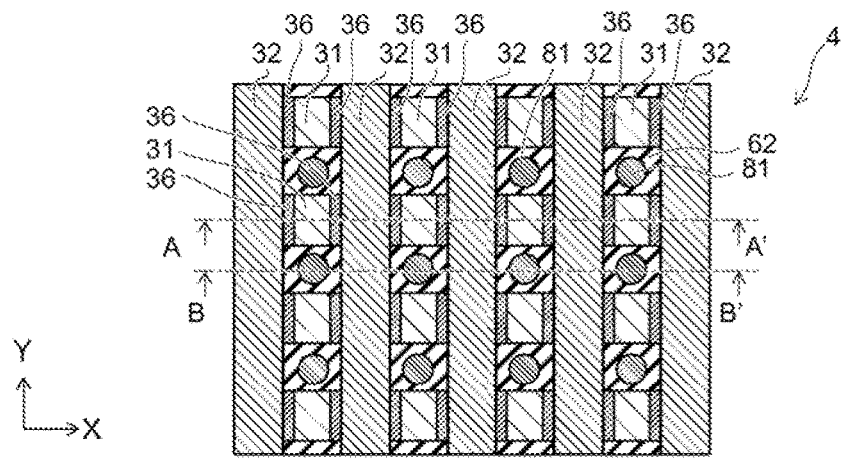
FIG. 17A is a plan view showing a memory device according to a fourth embodiment.
Figure 17B:
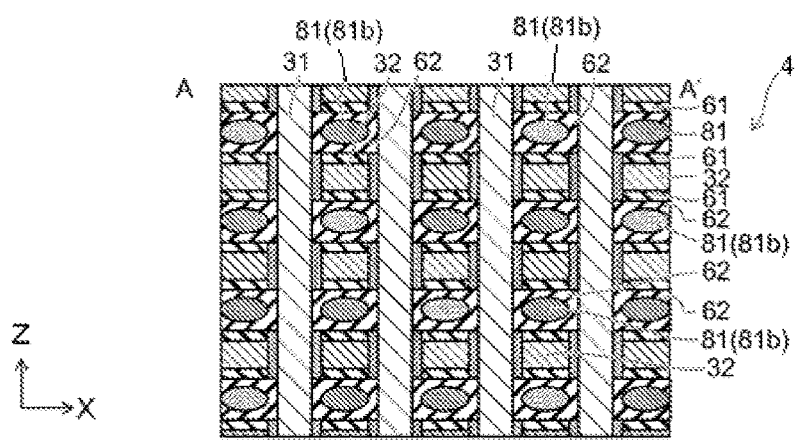
FIG. 17B is a sectional view taken along line A-A' in FIG. 17A.
Figure 17C:
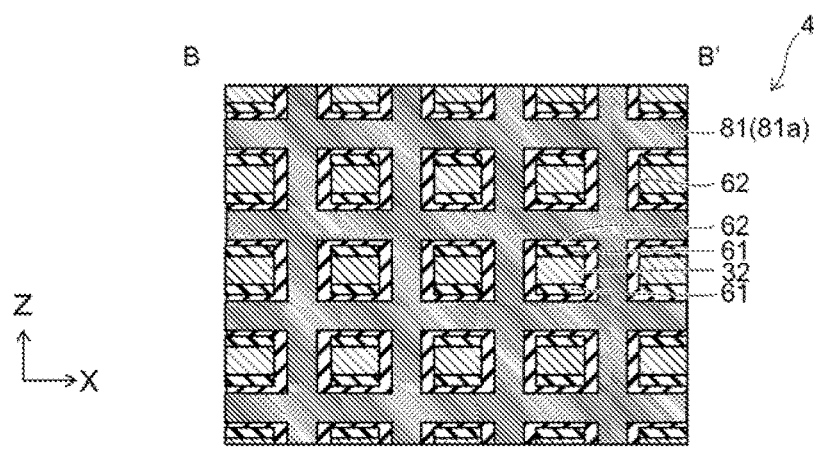
FIG. 17C is a sectional view taken along line B-B' in FIG. 17A.

FIG. 17A is a plan view showing a memory device according to the embodiment, FIG. 17B is a sectional view taken along line A-A' in FIG. 17A, and FIG. 17C is a sectional view taken along line B-B' in FIG. 17A.

As shown in FIG. 17A to FIG. 17C, the memory device 4 according to the embodiment is different from the memory device 3 (see FIG. 11A to FIG. 11C) according to the third embodiment in that heat conducting wirings 81 are provided in the interlayer insulation film 62. The heat conducting wirings 81 are formed of, conductive material, for example, a metallic material, for example, tungsten or aluminum. The heat conducting wiring 81 is embedded in the interlayer insulation film 62, and does not connect to the other wirings including the local bit line 31 and the local word line 32. In other words, the interlayer insulation film 62 is arranged between each of the local bit line 31, the local word line 32 and the variable resistance film 36, and the heat conducting wiring 81.

In the heat conducting wiring 81, lattice-like portions 81a and connection portions 81b are provided. The lattice-like portion 81a is arranged between two adjacent local bit lines 31 in the Y direction. Further, the lattice-like portion 81a has a shape of a lattice which becomes widened in the X direction and the Z direction and local word lines 32 are divided with each other as viewed in the Y direction. Further, the connection portion 81b is arranged between two adjacent local word lines 32 in the Z direction and connects two lattice-like portions 81a with each other in the Y direction.

Further, when the silicon substrate 10 is insulated from the global bit line, the heat conducting wiring 81 may connect to the silicon substrate 10. Further, the heat conducting wiring 81 may be drawn out up to the top face of the memory device 4. An air gap may be formed in the heat conducting wiring 82. Further, an air gap may be formed in the interlayer insulation film 62.

Hereinafter, the manufacturing method of the memory device 4 according to the embodiment will be described.

Firstly, after the global bit line 11 and the wiring selecting unit 20 are formed on the silicon substrate 10, the processes shown in FIG. 13A to FIG. 13C, FIG. 14A to FIG. 14C and FIG. 15A to FIG. 15C are performed.

Subsequently, insulation material such as silicon oxide is deposited up to a thickness which causes insulation property to be secured, and thus the interlayer insulation film 62 is formed. In this case, it is preferable that an independent air gap is not formed in the interlayer insulation film 62. Subsequently, as shown in FIG. 17A to 17C, conductive material such as metallic material is embedded on the interlayer insulation film 62 in the slit 72 and the cavity 73, and thus the heat conducting wiring 81 is formed. According to the measure, the memory device 4 according to the embodiment is manufactured.

Subsequently, the effect of the embodiment will be described.

In the embodiment, since the heat conducting wiring 81 is provided in the memory device 4, excellent heat radiation property is provided. Further, if the heat conducting wiring 82 may be drawn out to the upward portion of the memory device 4, the heat conducting wiring 82 may easily connect a heat sink and the like provided in the external portion of the memory device 4.

In the embodiment, the configuration, the operation, the manufacturing method and the effect other than the description described above are the same as those of the first embodiment.

Further, each embodiment described above provides an example in which the super lattice film formed of germanium-antimony-tellurium (GeSbTe) is provided as the variable resistance film 36, but is not limited thereto. For example, instead of germanium (Ge), elements belonging to the fourteenth group (group IV) other than germanium may be used. For example, silicon (Si) or carbon (C) may be used. Further, instead of antimony (Sb), an element belonging to the fifteenth group (group V) other than antimony may be used. Further, instead of tellurium (Te), an element of the sixteenth group (chalcogen) other than tellurium may be used. For example, instead of antimony-tellurium (SbTe), a chalcogen compound of a transition metal may be used, and bismuth-tellurium (BiTe) may be used. Furthermore, the variable resistance film 36 may be a phase change film other than the super lattice film.

According to the embodiments described above, it is possible to achieve a memory device and the manufacturing method of the memory device in which the interference between the memory cells is suppressed.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory device comprising:
   a substrate having a first surface;
   a plurality of bit lines disposed on the substrate in a matrix array along a first direction and a second direction that are each parallel to the first surface, each bit line extending away from the first surface in a third direction that is orthogonal to the first and second directions, the plurality of bit lines including a first bit line and a second bit line spaced from the first bit line in the first direction;
   a plurality of word lines above the first surface in the third direction and extending along the second direction and spaced from each other in the first and third directions, the plurality of word lines including a first word line and a second word line adjacent to the first word line in the first direction and between the first and second bit lines in the first direction;
   a first variable resistance film between, in the first direction, the first word line and the first bit line;

a second variable resistance film between, in the first direction, the second word line and the second bit line;
an insulating material between, in the first direction, the first and second word lines and the first and second bit lines; and
a plurality of air gaps between the first and second bit lines in the first direction.

2. The device according to claim 1, wherein the air gaps of the plurality of air gaps each extend in the second direction, and the plurality of air gaps includes a first air gap that is between the first word line and a third word line of the plurality of word lines in the third direction and a second air gap that is between the second word line and a fourth word line of the plurality of word lines in the third direction.

3. The device according to claim 2, wherein the insulating material includes a first insulating film disposed on the first word line and a second insulating film disposed on the first insulating film and the first bit line.

4. The device according to claim 3, wherein the second insulating film separates the first bit line from the first air gap.

5. The device according to claim 2, wherein the first and second air gaps each have a rectangular cross-sectional shape in a plane that is orthogonal to the second direction.

6. The device according to claim 2, wherein the first and second air gaps each have an oval cross-sectional shape in a plane that is orthogonal to the second direction.

7. The device according to claim 6, further comprising:
a third bit line of the plurality of bit lines that is adjacent to the first bit line in the second direction;
a fourth bit line of the plurality of bit lines that is adjacent to second bit line in the second direction;
a third air gap between the first bit line and the third bit line in the second direction; and
a fourth air gap between the second bit line and the fourth bit line in the second direction.

8. The device according to claim 7, wherein the third and fourth air gaps extend in the first direction for a distance spanning multiple word lines of the plurality of word lines disposed along the first direction.

9. The device according to claim 1, further comprising:
a third bit line of the plurality of bit lines that is adjacent to the first bit line in the second direction; and
a fourth bit line of the plurality of bit lines that is adjacent to second bit line in the second direction, wherein no air gaps are between the first bit line and the third bit line in the second direction, and no air gaps are between the second bit line and the fourth bit line in the second direction.

10. The device according to claim 1, wherein the first variable resistance film is in direct contact with the first bit line and the first word line, and the second variable resistance film is in direct contact with the second bit line and the second word line.

11. The device according to claim 1, wherein
the plurality of bit lines in the matrix array are evenly spaced apart along the second direction and along the first direction,
the plurality of word lines are evenly spaced apart along the third direction, and
two word lines of the plurality of words lines that are at a same distance from the first surface along the third direction are connected to each bit line of the plurality of bit lines on opposite sides of each bit line of the plurality of bit lines in the first direction.

12. The device according to claim 1, wherein
the first variable resistance film comprises germanium.

13. The device according to claim 1, further comprising:
a wiring selection unit between the first surface and the plurality of bit lines in the third direction, the wiring selection unit including a thin film transistor.

14. The device according to claim 13, further comprising:
a global bit line connected to the wiring selection unit and between the first surface and the wiring selection unit in the third direction.

* * * * *